United States Patent
Koyata et al.

(10) Patent No.: US 7,601,644 B2
(45) Date of Patent: Oct. 13, 2009

(54) METHOD FOR MANUFACTURING SILICON WAFERS

(75) Inventors: Sakae Koyata, Tokyo (JP); Tomohiro Hashii, Tokyo (JP); Katsuhiko Murayama, Tokyo (JP); Kazushige Takaishi, Tokyo (JP); Takeo Katoh, Tokyo (JP)

(73) Assignee: Sumco Corporation, Tokyo (JP)

( * ) Notice: Subject to any disclaimer, the term of this patent is extended or adjusted under 35 U.S.C. 154(b) by 197 days.

(21) Appl. No.: 11/597,169

(22) PCT Filed: Sep. 2, 2005

(86) PCT No.: PCT/JP2005/000161

§ 371 (c)(1),
(2), (4) Date: Nov. 21, 2006

(87) PCT Pub. No.: WO2006/072998

PCT Pub. Date: Jul. 13, 2006

(65) Prior Publication Data

US 2007/0224821 A1    Sep. 27, 2007

(30) Foreign Application Priority Data

Sep. 6, 2004  (JP)  ............................. 2004-257886
Aug. 18, 2005  (JP)  ............................. 2005-237520

(51) Int. Cl.
*H01L 21/311* (2006.01)

(52) U.S. Cl. ..................................................... 438/692

(58) Field of Classification Search .................. 438/692
See application file for complete search history.

(56) References Cited

U.S. PATENT DOCUMENTS

| 5,679,212 | A | * | 10/1997 | Kato et al. ................... 438/692 |
| 5,863,829 | A | * | 1/1999 | Nakayoshi et al. ........... 438/459 |
| 5,882,539 | A | * | 3/1999 | Hasegawa et al. ............. 216/88 |
| 5,942,449 | A | * | 8/1999 | Meikle ........................ 438/747 |
| 6,043,156 | A |   | 3/2000 | Kai et al. |

(Continued)

FOREIGN PATENT DOCUMENTS

EP  1 313 135 A1   5/2003

(Continued)

OTHER PUBLICATIONS

Supplementary European Search Report for Application No. EP 05 78 1387 dated Aug. 12, 2008.

*Primary Examiner*—Thanh V Pham
*Assistant Examiner*—Caleb Henry
(74) *Attorney, Agent, or Firm*—Pillsbury Winthrop Shaw Pittman, LLP

(57) ABSTRACT

This silicon wafer production process comprises in the order indicated a planarization step, in which the front surface and the rear surface of a wafer are ground or lapped, a single-wafer acid etching step, in which an acid etching liquid is supplied to the surface of the wafer while spinning and the entire wafer surface is etched to control the surface roughness Ra to 0.20 μm or less, and a double-sided simultaneous polishing step, in which the front surface and the rear surface of the acid etched wafer are polished simultaneously. The process may comprise a single-sided polishing step, in which the top and bottom of the acid etched wafer are polished in turn, instead of the double-sided simultaneously polishing step.

4 Claims, 7 Drawing Sheets

U.S. PATENT DOCUMENTS

| | | |
|---|---|---|
| 6,234,873 B1 * | 5/2001 | Yamamoto et al. ............ 451/41 |
| 6,239,039 B1 | 5/2001 | Nihonmatsu et al. |
| 6,346,485 B1 | 2/2002 | Nihonmatsu et al. |
| 6,376,395 B2 * | 4/2002 | Vasat et al. ................. 438/795 |
| 6,432,837 B2 | 8/2002 | Nihonmatsu et al. |
| 6,508,952 B1 * | 1/2003 | Lee et al. ................... 252/79.1 |
| 6,586,342 B1 * | 7/2003 | Mayer et al. ................ 438/754 |
| 2003/0104698 A1 | 6/2003 | Taniguchi et al. |
| 2003/0171075 A1 | 9/2003 | Nihonmatsu et al. |

FOREIGN PATENT DOCUMENTS

| | | |
|---|---|---|
| JP | 06-338484 | 12/1994 |
| JP | 09-246220 | 9/1997 |
| JP | 09-260314 | 10/1997 |
| JP | 11-135464 | 5/1999 |
| JP | 11-135474 | 5/1999 |
| JP | 11-233485 | 8/1999 |
| JP | 11-251290 | 9/1999 |
| JP | 2001-93876 | 4/2001 |
| JP | 2002-25975 | 1/2002 |
| JP | 2002-203823 | 7/2002 |

* cited by examiner

METHOD FOR MANUFACTURING SILICON WAFERS

This application is a U.S. National Phase Application of PCT/JP2005/016121, filed on Sep. 2, 2005, which relies for priority on, Japanese Patent Application No. 2004-257886, filed on Sep. 6, 2004, and Japanese Patent Application No. 2005-237520, filed on Aug. 18, 2005, the contents of all of which are incorporated herein by reference.

TECHNICAL FIELD

The present invention relates to a method for manufacturing silicon wafers which enables both of high flatness and reduction of surface roughness together with reduction of the load of the double-sided simultaneous polishing step.

BACKGROUND ART

Typically, the process of producing semiconductor silicon wafers includes subjecting wafers which are obtained by cutting out and slicing a pulled silicon single crystal ingot to beveling, mechanical polishing (lapping), etching, mirror polishing (polishing) and rinsing steps, and the wafers having highly accurate flatness are produced.

Silicon wafers that have being subjected to mechanical processing steps such as block cutting, outer diameter grinding, slicing and lapping have a damaged layer that is a processing damaged layer in their surfaces. In device production processes, the processing damaged layer induces slip dislocation and other crystal defects, and also the processing damaged layer decreases wafer mechanical strength, and has a detrimental effect on electrical characteristics. Therefore they must be removed.

Etching treatment is performed to remove this processing damaged layer. Examples of the etching treatment includes a batch-type acid etching in which the damaged layer is chemically removed by immersing a plurality of wafers in an etching tank containing a mixed acid or other etching liquid, and a batch-type alkaline etching in which the damaged layer is chemically removed by immersing wafers in an etching tank containing a NaOH or other alkaline etching liquid.

More specifically, as shown in FIG. 10, in the batch-type acid etching, at first a plurality of wafers 1a are held vertically in a holder 1, and this holder 1 is lowered as shown with the solid line arrow in FIG. 10. Then, the wafers are immersed in an aqueous acid etching solution 2a such as a mixed acid contained in an etching tank 2, thereby removing the damaged layers in the wafer surfaces with the aqueous etching solution. Subsequently, the holder 1 which holds the wafers 1a that are immersed in the aqueous etching solution 2a for a predetermined amount of time is pulled up as shown with the broken line arrow in FIG. 10. Next, the holder 1 which holds the wafers 1a that have been subjected to the acid etching is lowered as shown with the solid line arrow in FIG. 10, and the wafers 1a are immersed in a rinsing liquid 3a such as a pure water contained in a rinsing tank 3 so as to remove the aqueous etching solution adhered to the surfaces of the wafers. Subsequently, the holder 1 which holds the wafers 1a that are immersed in the rinsing solution 3a for a predetermined amount of time is pulled up as shown with the broken line arrow in FIG. 10, and then the silicon wafers 1a are dried.

The batch-type acid etching enables the damaged layer to be etched while improving the wafer surface roughness; however, the flatness obtained by lapping ends up being impaired, and there is the problem of the formation of waviness in the order of several millimeters and surface irregularities which are referred to as peelings in the etched surface. In addition, the batch-type alkaline etching enables etching of the damaged layer while maintaining the wafer flatness; however, pits having a local depth of several micrometers and measuring several to several tens of micrometers in size (hereinafter referred to as "facets") are formed, which cause the problem of worsening wafer surface roughness.

As shown in FIG. 9, as an example of a process for solving these problems, a wafer processing process and wafers processed by this process have been proposed which includes subjecting semiconductor wafers that are obtained by slicing a single crystal ingot to at least beveling 5, lapping 6, etching 7, 8, mirrored surface polishing 9 and rinsing, wherein the etching includes alkaline etching 7 and acid etching 8 after the alkaline etching 7, and the etching amount of the alkaline etching 7 is made to be greater than that of the acid etching 8 (see, for example, Patent Document 1).

In accordance with the process indicated in Patent Document 1, the flatness after lapping can be maintained, and surface waviness after the etching can be reduced, thereby the formation of locally deep pits and the worsening of surface roughness can be inhibited. Moreover, chemically etched wafers can be produced which have etched surfaces that are resistant to the occurrence of contamination by particles, stains and the like. Such wafers enable the polishing allowance for mirror polishing to be reduced, and also their flatness can be improved.

In processes of the prior arts including the process indicated in Patent Document 1, wafers that have being etched is subjected to a double-sided simultaneous polishing step or a single-sided polishing step so as to process their surfaces to a mirrored surfaces. However, the wafer flatness at the time when the planarization step is completed can not be maintained in the front surface and the rear surface of the silicon wafers on which the etching has been completed. Also, the desired wafer surface roughness can not be obtained. Therefore, a large polishing allowance is required in the double-sided simultaneous polishing step and the single-sided polishing step so as to improve wafer flatness and wafer surface roughness. Thereby, a considerable load has been placed on the double-sided simultaneous polishing step and the single-side polishing step.

Patent Document 1 Japanese Patent Application, First Publication No. H11-233485 (claim 1 and paragraph [0042])

DISCLOSURE OF THE INVENTION

Problems to be Solved by the Invention

An object of the present invention is to provide a method for manufacturing silicon wafers which enables both of maintaining of excellent wafer flatness as that at the time when the planarization step is completed and reduction of wafer surface roughness, together with reducing the load on the double-sided simultaneous polishing and the single-sided polishing steps.

Means for Solving the Problems

A method for manufacturing silicon wafers of a first aspect of the present invention includes in the order indicated: a planarization step of grinding or lapping a front surface and a rear surface of a silicon wafer which is in a form of a thin disk and is obtained by slicing a silicon single crystal ingot; a single-wafer acid etching step of supplying an acid etching liquid to the surface of the planarized single silicon wafer while spinning the single silicon wafer, thereby spreading the supplied acid etching liquid over the entire wafer surface due to centrifugal force generated by spinning, and etching the entire wafer surface so as to control the surface roughness Ra of the wafer surface to 0.20 μm or less; and a double-sided simultaneous polishing step of polishing both of the front surface and the rear surface of the acid-etched single silicon wafer simultaneously.

In the method for manufacturing silicon wafers of the first aspect, the surface roughness and the texture size are controlled before polishing by the single-wafer acid etching step that uses the acid etching liquid. Thereby, both of a maintaining of the wafer flatness as that at the time when the planarization step is completed and a reduction of the wafer surface roughness can be achieved together with respectively reducing the polishing allowances of the front surface and the rear surface of the wafer in the double-sided simultaneous polishing step.

In the method for manufacturing silicon wafers of the first aspect, the acid etching liquid may be an aqueous solution containing hydrofluoric acid, nitric acid and phosphoric acid respectively, and the mixing ratio as percents by weight of the hydrofluoric acid, nitric acid, phosphoric acid and water in the aqueous solution may be such that hydrofluoric acid:nitric acid:phosphoric acid=4.5% to 10.5%:25.5 to 40.0%:30.0 to 45.5%.

In this case, the use of the aqueous solution respectively containing hydrofluoric acid, nitric acid and phosphoric acid in the predetermined mixing ratio for the acid etching liquid makes it possible to further reduce the wafer surface roughness and to obtain more excellent wafer flatness at the time when the etching step is completed.

In addition, the spinning speed at which the wafer is spun in the single-wafer acid etching step may be 500 to 2000 rpm.

The viscosity of the acid etching liquid may be 10 to 35 mPa·sec.

The surface tension of the acid etching liquid may be 55 to 60 dyne/cm.

A method for manufacturing silicon wafers of a second aspect of the present invention includes, in the order indicated: a planarization step of grinding or lapping a front surface and a rear surface of a silicon wafer which is in a form of a thin disk and is obtained by slicing a silicon single crystal ingot; a single-wafer acid etching step of supplying an acid etching liquid to the surface of the planarized single silicon wafer while spinning the single silicon wafer, thereby spreading the supplied acid etching liquid over the entire wafer surface due to centrifugal force generated by spinning, and etching the entire wafer surface so as to control the surface roughness Ra of the wafer surface to 0.20 μm or less; and a single-sided polishing step of polishing one of the front surface and the rear surface of the acid-etched single silicon wafer, and then polishing the other one.

In the method for manufacturing silicon wafers of the second aspect, the surface roughness and the texture size are controlled before polishing by the single-wafer acid etching step that uses the acid etching liquid. Thereby, both of a maintaining of the wafer flatness as that at the time when the planarization step is completed and a reduction of the wafer surface roughness can be achieved together with respectively reducing the polishing allowances of the front surface and the rear surface of the wafer in the single-sided simultaneous polishing step.

In the method for manufacturing silicon wafers of the second aspect, the acid etching liquid may be an aqueous solution containing hydrofluoric acid, nitric acid and phosphoric acid respectively, and the mixing ratio as percents by weight of the hydrofluoric acid, nitric acid, phosphoric acid and water in the aqueous solution may be such that hydrofluoric acid:nitric acid:phosphoric acid=4.5% to 10.5%:25.5 to 40.0%:30.0 to 45.5%.

In this case, the use of the aqueous solution respectively containing hydrofluoric acid, nitric acid and phosphoric acid in the predetermined mixing ratio for the acid etching liquid makes it possible to further reduce the wafer surface roughness and to obtain more excellent wafer flatness at the time when the etching step is completed.

In addition, the spinning speed at which the wafer is spun in the single-wafer acid etching step may be 500 to 2000 rpm.

The viscosity of the acid etching liquid may be 10 to 35 mPa·sec.

The surface tension of the acid etching liquid may be 55 to 60 dyne/cm.

Effects of the Invention

In the method for manufacturing silicon wafers of the present invention, the wafer surface roughness and the texture size can be controlled before polishing by the single-wafer acid etching step that uses the acid etching liquid. As a result, both of a maintaining of the wafer flatness as that at the time when the planarization step is completed and a reduction of the wafer surface roughness can be achieved, together with respectively reducing the polishing allowances of the front surface and the rear surface of the wafer in the double-sided simultaneous polishing step or the single-sided polishing step. The use of this method makes it possible to considerably improve the productivity of wafer production.

BRIEF DESCRIPTION OF THE SYMBOLS 13 planarization step, 14 single-wafer acid etching step, and 16 double-sided simultaneous polishing step.

BEST MODE FOR CARRYING OUT THE INVENTION

The following provides an explanation of the best mode for carrying out the present invention based on the drawings.

First, the tip portion and the tail portion of a grown silicon single crystal ingot are cut to form into the shape of a block, and then the outer peripheral portion is ground so as to make the diameter of the ingot uniform; thereby, a block is formed.

Figure 1:
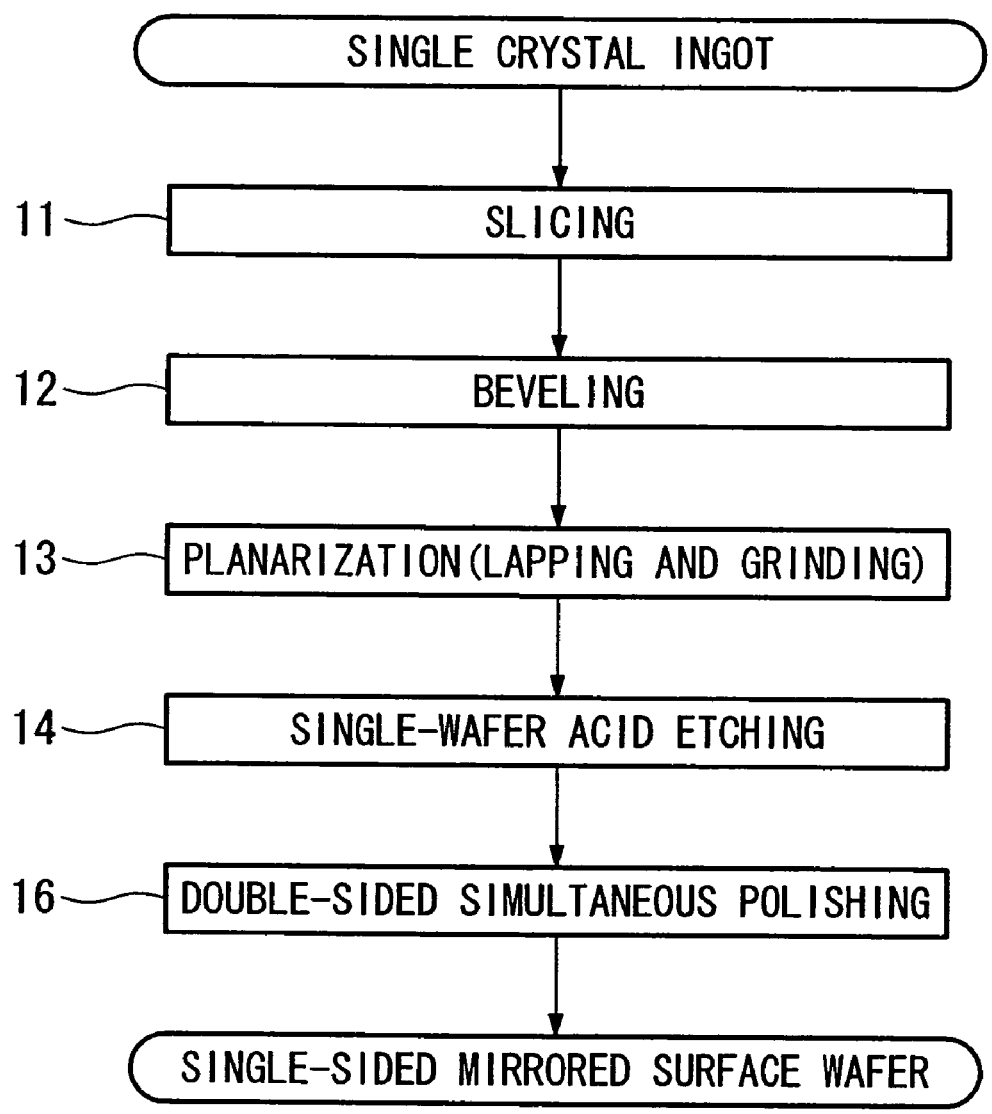
FIG. 1 is a flow chart showing a method for manufacturing silicon wafers of the present invention.

This block I subjected to orientation planarization and orientation notching so as on to indicate a specific crystal orientation. After this process, as shown in FIG. 1, the block is sliced at a predetermined angle relative to the axial direction (Step 11). The wafer sliced in the Step 11 is chamfered around the peripheral edge of the wafer so as to prevent chipping in the wafer periphery (Step 12). As a result of carrying out this beveling, a crowning phenomenon in which abnormal growth occurs resulting in the formation of ring-shaped protrusion around the periphery during epitaxial growth on the surface of the silicon wafer that has not been subjected to beveling can be inhibited.

Continuing it, surface irregularity layers in the front surface and the rear surface of the thin disk-shaped silicon wafer which are formed in the slicing and other steps are planarized so as to enhance the flatness of the front surface and the rear surface and the degree of parallelization of the wafer (Step 13). In this planarization step 13, the front surface and the rear surface of the wafer are planarized by grinding or lapping.

Figure 2:
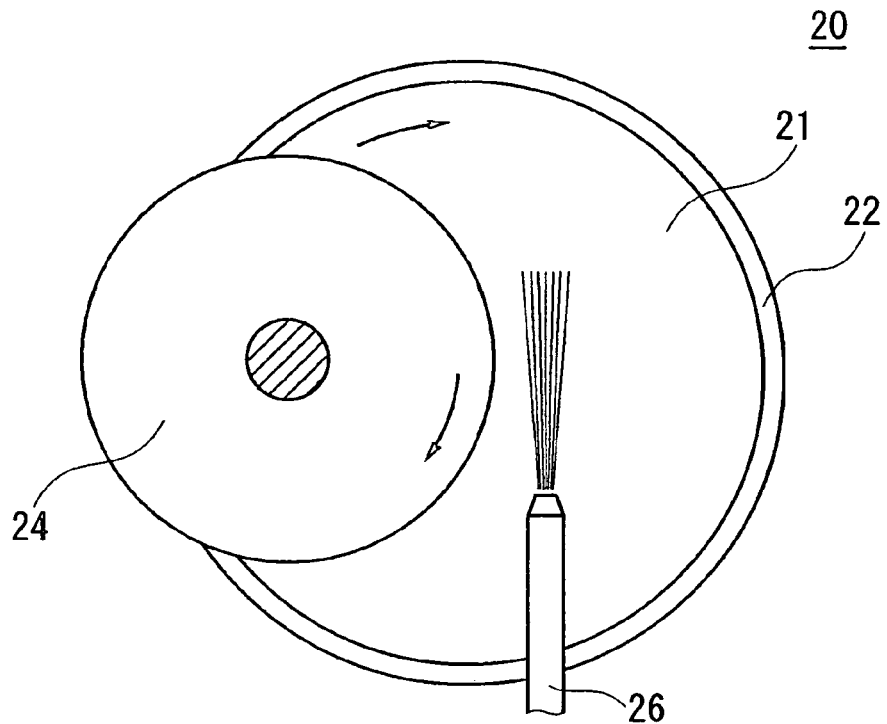
FIG. 2 is an overhead view of a grinding apparatus.
Figure 3:
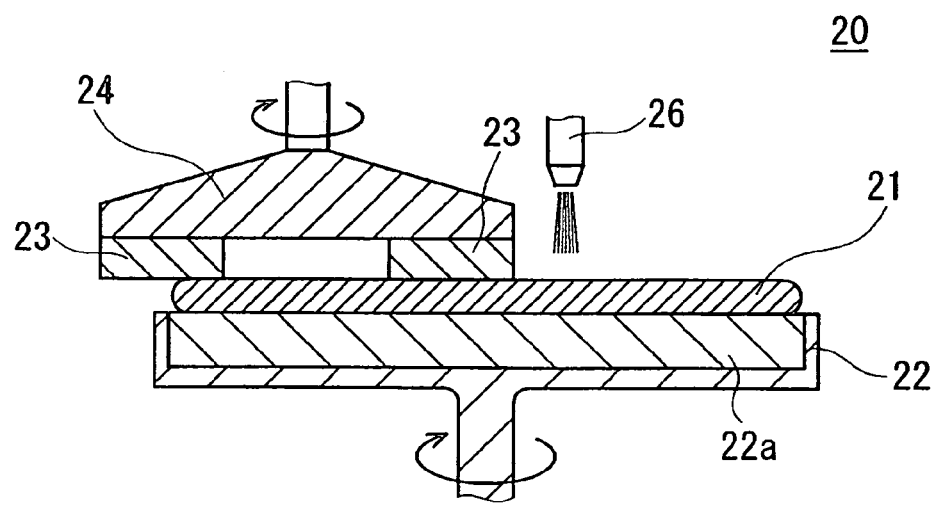
FIG. 3 is a longitudinal cross-sectional view of the grinding apparatus.

Flattening of the wafer by grinding may be carried out using a grinding apparatus 20 such as that shown in FIGS. 2 and 3. As shown in FIG. 2, a turntable 22 which is a support unit of a processed object for holding a silicon wafer 21 is included such that it allows to rotate about the vertical axis by a driving mechanism not shown. In addition, as shown in FIG. 3, a grindstone supporting means 24 for supporting a grindstone for grinding 23 is provided above the turntable 22 such that it is pushed towards the ground surface of the silicon wafer 21 which is suctioned to be held by means of a chuck 22a on the turntable 22. This grindstone supporting means 24 is included such that it can make the grindstone for grinding 23 rotate about the vertical axis by a driving mechanism not shown. In addition, a water supply nozzle 26 for supplying grinding water to the surface of the silicon wafer 21 during grinding is provided above the silicon wafer. In this type of the grinding apparatus 20, the grindstone for grinding 23 and the silicon wafer 21 are rotated relative to each other by their respective driving mechanisms. Furthermore, the grinding water is supplied from the water supply nozzle 26 to a portion which is far from a portion which is in contact with the grindstone for grinding 23 on the front surface of the silicon wafer 21. Thereby, the grindstone for grinding 23 is pushed towards the front surface of silicon wafer 21 to grind the front surface of the silicon wafer 21 while the front surface is washed.

Figure 4:
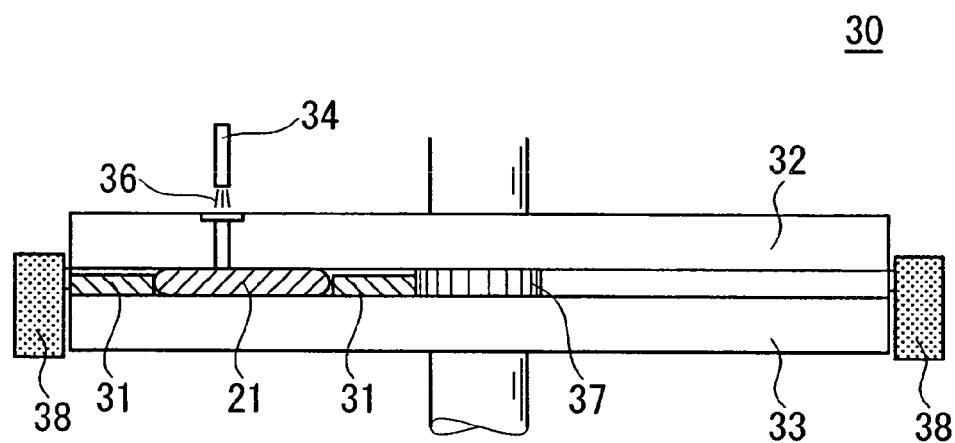
FIG. 4 is a configuration diagram of a lapping apparatus.

Flattening of a wafer by lapping may be carried out using a lapping apparatus 30 such as that shown in FIG. 4. As shown in FIG. 4, a carrier plate 31 is engaged with a sun gear 37 and an internal gear 38 of the lapping apparatus 30, and then the silicon wafer 21 is placed in a holder of the carrier plate 31. Subsequently, both sides of this silicon wafer 21 are held so as to be sandwiched between an upper surface plate 32 and a lower surface plate 33. Together with supplying an abrasive 36 from a nozzle 34, the carrier plate 31 is made to perform a planetary movement by the sun gear 37 and the internal gear 38, and at the same time, the upper surface plate 32 and the lower surface plate 33 are rotated in directions relative to each other. As a result, both sides of the silicon wafer 21 are lapped simultaneously.

In the silicon wafer that has been subjected to the planarization step 13 in this manner, the flatness of the front surface and the rear surface and the degree of parallelization of the wafer are improved, and then the silicon wafer is rinsed in a rinsing step and is subjected to a subsequent step.

Next, as shown in FIG. 1, an acid etching liquid is supplied to the surface of the planarized single silicon wafer while spinning the wafer; thereby, the supplied acid etching liquid is spread over the entire wafer surface due to a centrifugal force generated by the spinning. The entire wafer surface is etched such that the surface roughness Ra of the wafer surface is controlled to be 0.20 μm or less (Step 14). In this single-wafer acid etching step 14, damaged layers introduced by mechanical processing processes such as those of the beveling step 12 and the planarization step 13 are completely removed by the etching. The surface roughness and the texture size of the wafer are controlled by carrying out the single-wafer etching using the acid etching liquid. As a result, both of the maintaining of the wafer flatness as that at the time when the planarization step is completed and the reduction of the wafer surface roughness can be achieved, together with respectively reducing the polishing allowances of the front surface and the rear surface of the wafer in a subsequent double-sided simultaneous polishing step 16 or single-sided polishing step. The etching allowance in this single-wafer acid etching step 14 is preferably 14 to 16 μm for one side surface, and the total allowance of the front surface and the rear surface of the wafer is preferably 28 to 32 μm. The polishing allowances in the subsequent double-sided simultaneous polishing step or single-sided polishing step can be reduced considerably by making the etching allowance within those ranges. If the etching allowance is less than the lower limit, the wafer surface roughness cannot be sufficiently reduced. Therefore, the load placed on the double-sided simultaneous polishing or the single-sided polishing becomes large. If the etching allowance exceeds the upper limit, the wafer flatness is impaired which worsens the productivity of wafer production. In this single-wafer acid etching step, the surface roughness Ra of the wafer surface is controlled to 0.20 μm or less and preferably to 0.05 μm or less. The polishing allowances in the subsequent double-sided simultaneous polishing step or single-sided polishing step can be decreased by controlling the surface roughness Ra of the wafer surface to within the above ranges; thereby, making it possible to improve the productivity of wafer production and reduce costs. If the surface roughness Ra of the wafer surface exceeds 0.20 μm, the problem occurs in which the polishing allowances increase in the subsequent double-sided simultaneous polishing step or single-sided polishing step.

Figure 5:
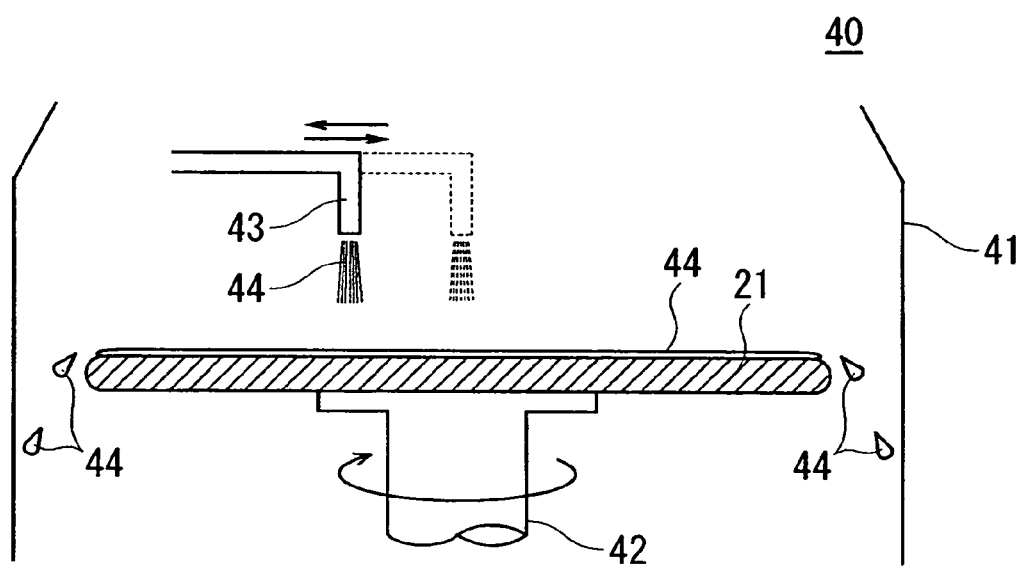
FIG. 5 is a configuration diagram of a single-wafer spinner.

In this single-wafer acid etching step, as shown in FIG. 5, the silicon wafer 21 is loaded onto a single-wafer spinner 40. Namely, the wafer 21 is held to be plane such that the front surface becomes the upper surface by a vacuum suction-type wafer chuck 21 disposed within a cup 41. And then, while horizontally moving an etching liquid supply nozzle 43 provided above the wafer 21 in a direction as shown by the solid arrow in FIG. 5, acid etching liquid 44 is supplied to the surface of the wafer 21 from the etching liquid supply nozzle 43. Together with it, the wafer 21 is spun by the wafer chuck 42. As a result, damaged layers in the wafer surface are removed by the acid etching treatment of the wafer surface. The acid etching liquid 44 supplied to the upper surface of the wafer 21 gradually moves from the center of the wafer to the outer periphery of the wafer due to the centrifugal force generated by spinning while etching the damaged layers in the wafer surface, and then is sprayed from the outer edge of the wafer in the form of liquid droplets 44.

Examples of the acid etching liquids used for the single-wafer etching of the present invention include aqueous solutions respectively containing hydrofluoric acid, nitric acid and acetic acid, aqueous solutions respectively containing hydrofluoric acid, nitric acid and phosphoric acid, and aqueous solutions respectively containing hydrofluoric acid, nitric acid, phosphoric acid and sulfuric acid. Among these, the aqueous solutions respectively containing hydrofluoric acid, nitric acid and phosphoric acid and the aqueous solutions respectively containing hydrofluoric acid, nitric acid, phosphoric acid and sulfuric acid are preferable since both of them allow the obtaining of a high degree of flatness. The aqueous solutions respectively containing hydrofluoric acid, nitric acid and phosphoric acid are particularly preferable since they are able to realize both of high flatness and low surface roughness, as well as the viscosity of the etching liquid to be adjusted to a predetermined range. In the case of using an aqueous solution respectively containing hydrofluoric acid, nitric acid and phosphoric acid, the mixing ratio as percents by weight of the hydrofluoric acid, the nitric acid and the phosphoric acid contained in the aqueous solution is preferably 4.5 to 10.5%:25.5 to 40.0%:30.0 to 45.5%. In the case of using an aqueous solution respectively containing hydrofluoric acid, nitric acid, phosphoric acid and sulfuric acid, the mixing ratio as percents by weight of the hydrofluoric acid, the nitric acid, the phosphoric acid and the sulfuric acid contained in the aqueous solution is preferably 4.5 to 10.5%: 25.5 to 40.0%:30.0 to 45.5% to 12.5 to 27.5%.

The viscosity of the etching liquid is preferably 10 to 35 mPa·sec, and more preferably 15 to 25 mPa·sec. If the viscosity is less than 10 mPa·sec, the viscosity of the liquid is too low, the acid etching liquid that has been dropped onto the upper surface of the wafer ends up being immediately spun off the wafer surface due to centrifugal force, and is unable to uniformly or adequately contact the wafer surface. Consequently, time is required to secure an adequate etching allowance; thereby, the productivity lowers. If the viscosity exceeds 35 mPa·sec, the acid etching liquid that has been dropped onto the wafer surface ends up remaining on the upper surface of the wafer for an amount of time that is longer than necessary. Consequently, it is no longer possible to control the surface or outer peripheral shape of the wafer; thereby, the problem of poor wafer flatness occurs.

In addition, the surface tension of the acid etching liquid is preferably 55 to 60 dyne/cm. If the surface tension is less than 55 dyne/cm, the acid etching liquid that has been dropped onto the upper surface of the wafer ends up being immediately spun off the wafer surface due to the centrifugal force, and is unable to uniformly or adequately contact the wafer surface. Consequently, time is required to secure an adequate etching allowance; thereby, the productivity lowers. If the surface tension exceeds 60 dyne/cm, the acid etching liquid that has been dropped onto the wafer surface ends up remaining on the upper surface of the wafer for an amount of time that is longer than necessary. Consequently, it is no longer possible to control the surface or outer peripheral shape of the wafer; thereby, the problem of poor wafer flatness occurs.

The spinning speed at which the silicon wafer 21 is spun in the single-wafer acid etching varies somewhat in accordance with the diameter of the silicon wafer, the viscosity of the acid etching liquid, the flow rate at which the acid etching liquid that drops onto the surface of the wafer is supplied; however, the spinning speed is preferably within a range of 500 to 2000 rpm. If the spinning speed is less than 500 rpm, it is not possible to control the in-plane shape or the outer peripheral shape of the wafer, thereby resulting in the problem of poor wafer flatness. If the spinning speed exceeds 2000 rpm, the acid etching liquid that has been dropped onto the upper surface of the wafer ends up being immediately spun off the wafer surface due to the centrifugal force, and is unable to uniformly or adequately contact with the wafer surface. Consequently, time is required to secure an adequate etching allowance; thereby, the productivity lowers.

After the acid etching treatment of the surface of the wafer 21, a rinsing liquid such as pure water is supplied to the upper surface of the wafer 21 by a rinsing liquid supply nozzle not shown while spinning the wafer 21 so as to rinse off the acid etching liquid 44 remaining on the surface of the wafer 21. After the rinsing, the wafer 21 is dried by spinning the wafer 21 after stopping the supply of rinsing liquid. Continuing it, the wafer 21 is turned over and the wafer 21 is held by the wafer chuck 42 with the rear surface of the wafer 21 facing upward, and then, the rear surface is subjected to the acid etching treatment, the rinsing liquid treatment and the drying treatment in the same manner.

Next, as shown in FIG. 1, a double-sided simultaneous polishing (Step 16) is carried out in which the front surface and the rear surface of the wafer which have been subjected to the single-wafer acid etching step 14 are polished simultaneously.

Figure 6:
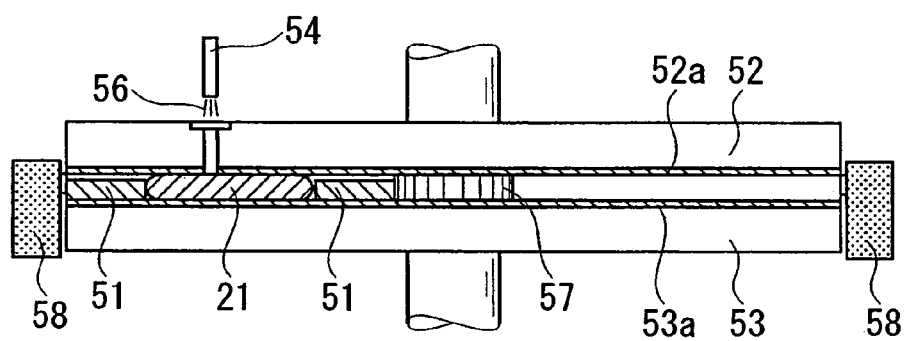
FIG. 6 is a configuration diagram of a double-sided simultaneous polishing apparatus.

The double-sided simultaneous polishing is carried out by a double-sided simultaneous polishing apparatus 50 as shown in FIG. 6. As shown in FIG. 6, a carrier plate 51 is first engaged with a sun gear 57 and an internal gear 58 of the double-sided simultaneous polishing apparatus 50, and then the silicon wafer 21 is placed in a holder of the carrier plate 51. Subsequently, both sides of this silicon wafer 21 are held so as to be sandwiched between an upper surface plate 52 on which a first abrasive cloth 52a is attached on the polishing surface side and a lower surface plate 53 on which a second abrasive cloth 53a is attached on the polishing surface side. Together with supplying an abrasive 56 from a nozzle 54, the carrier plate is made to perform planetary movement by the sun gear 57 and the internal gear 58, and at the same time, the upper surface plate 52 and the lower surface plate 53 are rotated in directions relative to each other. As a result, both sides of the silicon wafer 21 are simultaneously polished to a mirrored surface. The silicon wafer on which the previously-described single-wafer acid etching step has been carried out has a desired wafer surface roughness together with maintaining the wafer flatness as that at the time when the planarization step is completed. Therefore, in addition to being able to reduce the polishing allowance on the front surface and the rear surface of the wafer in this double-sided simultaneous polishing step 16, both of maintaining of the wafer flatness as that at the time when the planarization step is completed and the reduction of the wafer surface roughness can be achieved. In addition, as a result of simultaneously polishing the front surface and the rear surface of the silicon wafer while respectively controlling the rotating speeds of the upper surface plate 52 and the lower surface plate 53 in this double-sided simultaneous polishing step 16, single-sided mirrored surface wafers can be obtained in which the front surface and the rear surface of the wafer can be distinguished visually. In this manner, the use of the method for manufacturing silicon wafers of the present invention significantly improves the productivity of wafer production.

Here, the front surface and the rear surface of a wafer were polished simultaneously by the double-sided simultaneous polishing in the present embodiment; however, it goes without saying that the same effects can be obtained by polishing wafers by single-sided polishing in which the front surface and the rear surface of a wafer are polished in turn, instead of this double-sided simultaneous polishing.

EXAMPLES

The following provides a more detailed explanation of examples of the present invention along with its comparative examples.

Example 1

First, a φ200 mm silicon wafer was prepared and subjected to a planarization step in which the front surface and the rear surface of the silicon wafer was lapped using the lapping apparatus shown in FIG. 4. A #1000 abrasive containing $Al_2O_3$ was used for the abrasive in the lapping step, the abrasive was supplied at a flow rate of 2.0 L/min, the load of the upper surface plate was controlled to 100 g/cm², the rotating speed of the upper surface plate was controlled to 10 rpm, and the rotating speed of the lower surface plate was controlled to 40 rpm so as to planarize the silicon wafer.

Next, the silicon wafer on which the planarization was completed was subjected to the single-wafer acid etching using the single-wafer spinner shown in FIG. 5. An acid etching liquid including hydrofluoric acid, nitric acid and phosphoric acid at a mixing ratio of hydrofluoric acid:nitric acid:phosphoric acid=4.9%:33.4%:36.4% was used for the etching liquid. In addition, the spinning speed during the etching was controlled to 600 rpm, the flow rate at which the etching liquid was supplied was controlled to 10 L/min, and the etching was carried out for 150 seconds. The etching allowance during the single-wafer acid etching was 15 μm on one side surface.

Example 2

The planarization step and the etching step were carried out in the same manner as Example 1 with the exception of using an aqueous solution respectively containing hydrofluoric acid, nitric acid and acetic acid at a mixing ratio of hydrofluoric acid:nitric acid:acetic acid=8.95%:46.35%:14.72% for the etching liquid in the etching step.

Comparative Example 1

Figure 9:
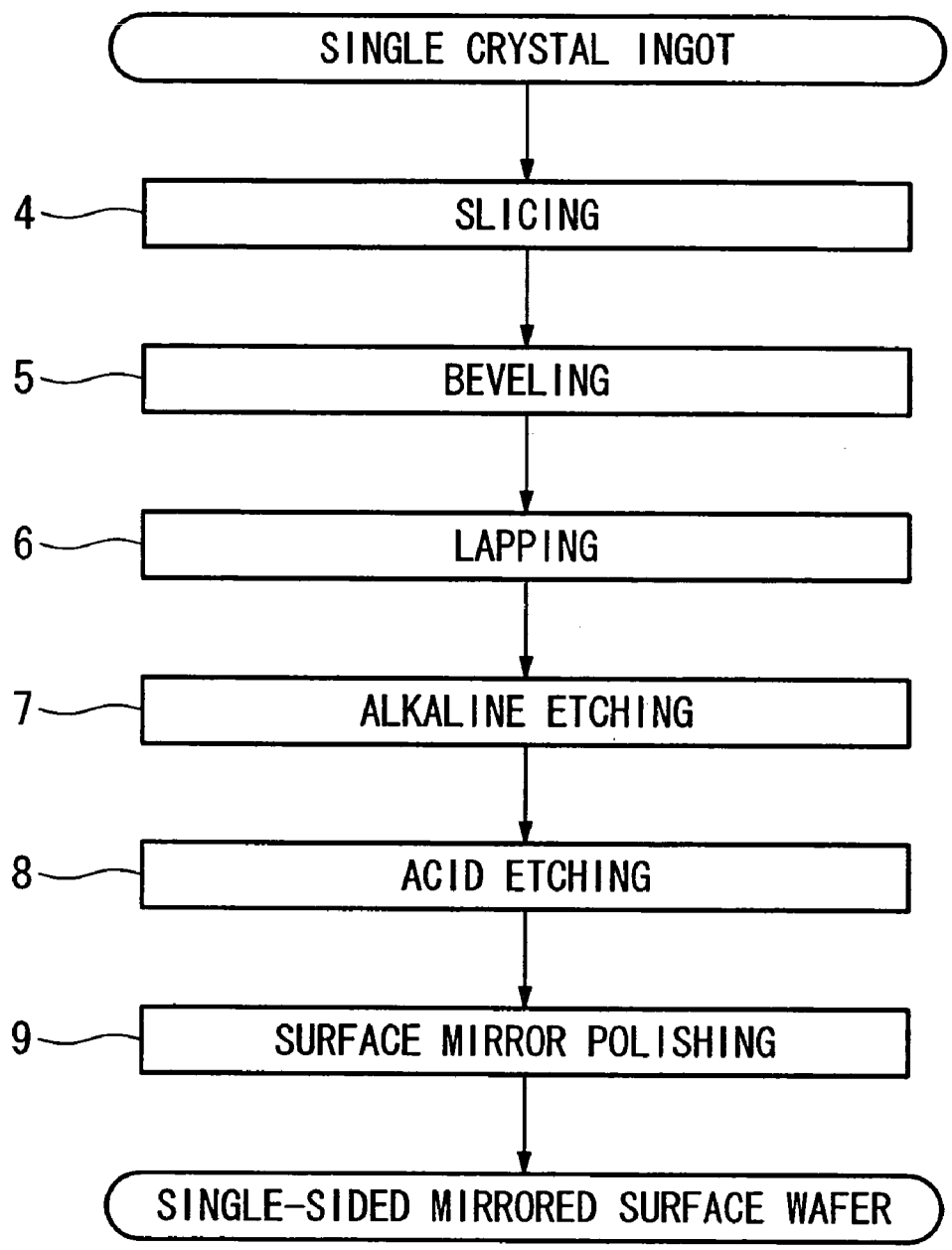
FIG. 9 is a flow chart showing a method for manufacturing silicon wafers of the prior art.
Figure 10:
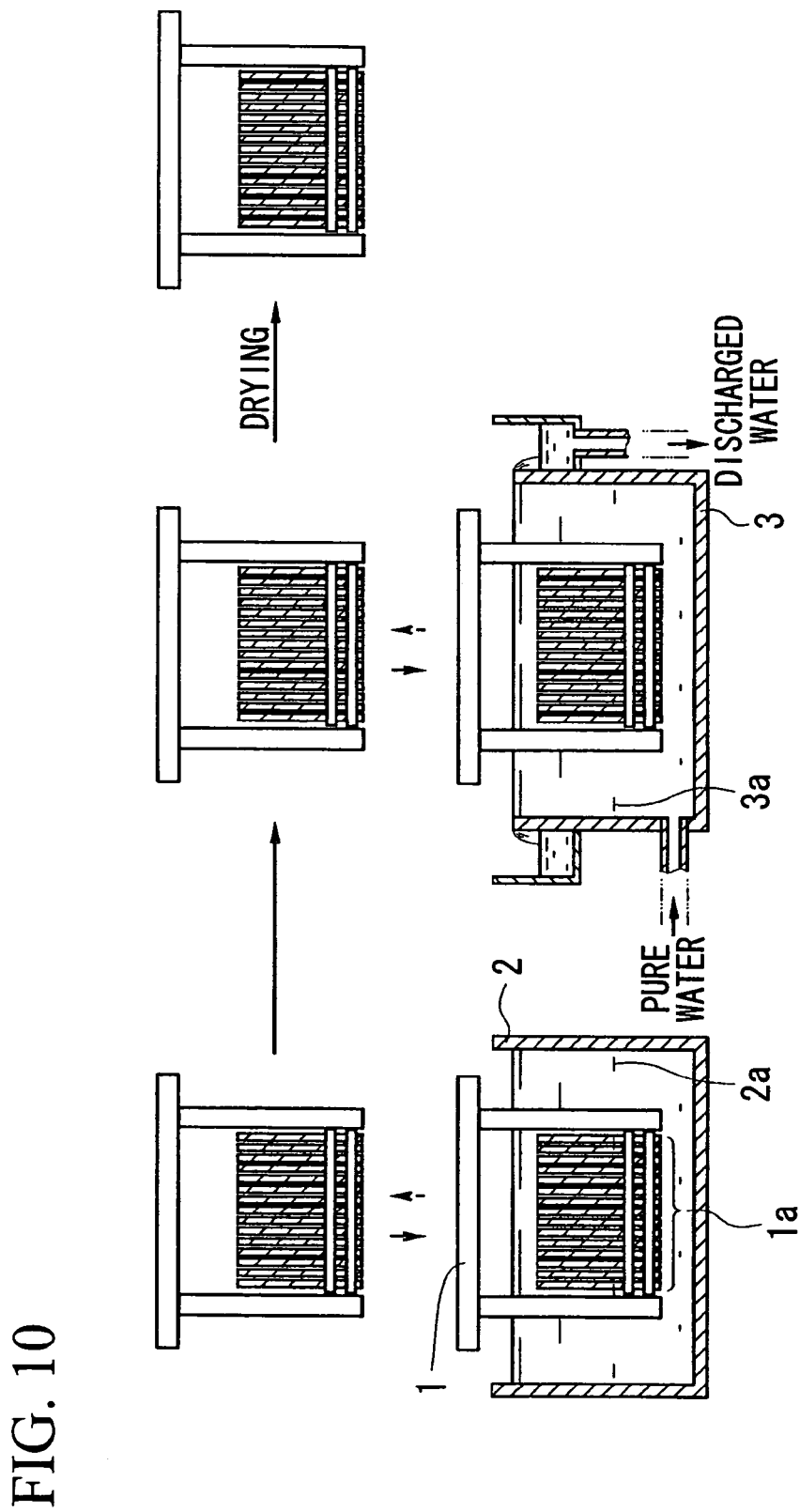
FIG. 10 is a drawing showing the processing steps of a batch-type etching.

The planarization step and the etching step were carried out in the same manner as Example 1 with the exception of carrying out the batch-type etching shown in FIG. 9 instead of the single-wafer etching.

Comparative Example 2

The planarization step and the etching step were carried out in the same manner as Comparative Example 1 with the exception of using an aqueous solution respectively containing hydrofluoric acid, nitric acid and acetic acid at a mixing ratio of hydrofluoric acid:nitric acid:acetic acid=8.95%:46.35%:14.72% for the etching liquid in the etching step.

Comparative Example 3

The planarization step and the etching step were carried out in the same manner as Comparative Example 1 with the exception of using a 48% by weight aqueous solution of NaOH for the etching liquid in the etching step.

Comparative Example 4

The planarization step and the etching step were carried out in the same manner as Comparative Example 1 with the exception of using a 48% by weight aqueous solution of KOH for the etching liquid in the etching step.

Comparative Example 5

The planarization step and the etching step were carried out in the same manner as Comparative Example 1 with the exception of using a #1500 abrasive containing $Al_2O_3$ in the lapping step and using a 48% by weight aqueous solution of KOH for the etching liquid in the etching step.

(Comparative Testing 1)

With regard to Examples 1 and 2 and Comparative Examples 1 to 5, the surface roughness and the wafer flatness as represented by total thickness variation (TTV) were measured for each of the silicon wafers using a non-contact surface profiler (Chapman Instrument Inc.). The results of the obtained wafer surface roughness and TTV for each of the silicon wafers in Examples 1 and 2 and Comparative Examples 1 to 5 are shown in FIG. 7.

Figure 7:
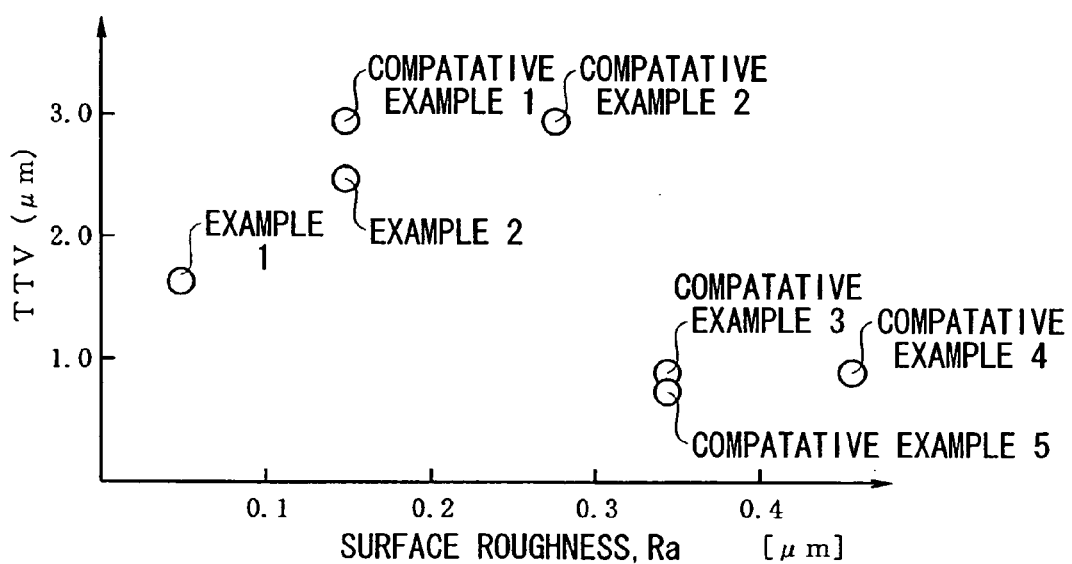
FIG. 7 is a drawing showing the relationship between the wafer surface roughness and TTV in silicon wafers obtained in Examples 1 and 2 and Comparative Examples 1 to 5.

As is apparent from FIG. 7, the wafer surface roughness was improved in Comparative Examples 1 and 2; however, the wafer flatness worsened. The wafer flatness was satisfactory in Comparative Examples 3 to 5; however, the wafer surface roughness was poor. Therefore, in Comparative Examples 1 to 5, it was necessary to increase the polishing allowance in the subsequent double-sided simultaneous polishing step. In contrast, the wafer surface roughness and the wafer flatness were improved in each of Examples 1 and 2 as compared with Comparative Examples 1 and 2; thereby, it enabled the polishing allowance in the subsequent double-sided simultaneous polishing step to be reduced considerably.

(Comparative Testing 2)

Double-sided simultaneous polishing was carried out on each of the silicon wafers obtained in Examples 1 and 2 and Comparative Examples 1 to 5. The polishing allowance in the double-sided simultaneous polishing was 5 μm for one side surface. The number of light point defects (LPD) which measures 65 nm or larger and are present on the wafer surface was determined for the resulting wafers using a light-scattering particle counter. The relationship between the number of LPD and the wafer surface roughness Ra determined in the Comparative Testing 1 is shown in FIG. 8.

Figure 8:
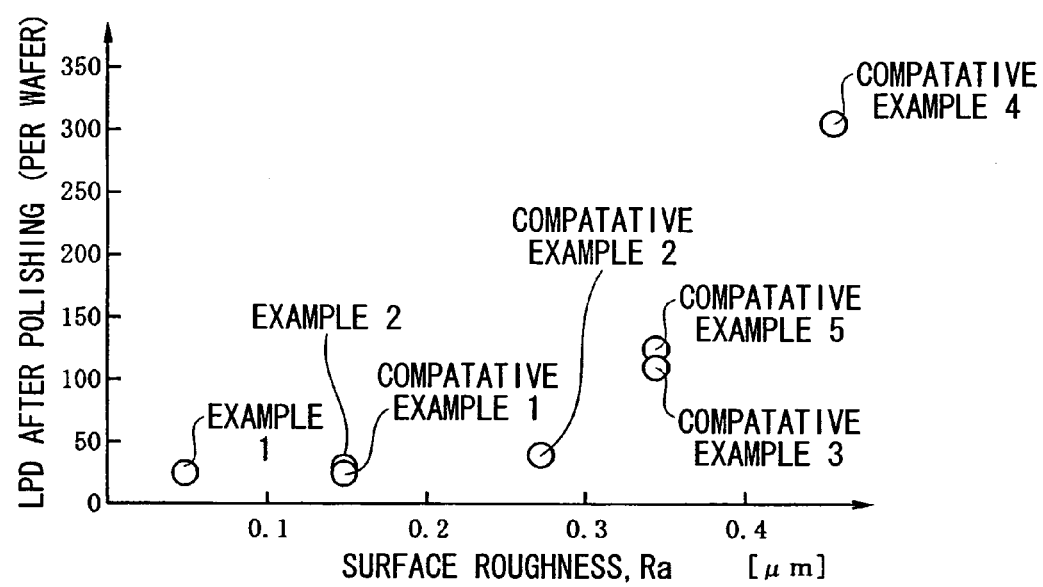
FIG. 8 is a drawing showing the relationship between the wafer surface roughness and LPD in silicon wafers obtained in Examples 1 and 2 and Comparative Examples 1 to 5.

As is apparent from FIG. 8, the surface roughness Ra after the etching and the surface quality after the polishing demonstrated a favorable correlation, and a satisfactory surface quality after the polishing was determined to be obtained at a surface roughness Ra of the wafer surfaces of 0.20 μm or less and preferably 0.5 μm or less.

INDUSTRIAL APPLICABILITY

In accordance with a method for manufacturing silicon wafers of the present invention, in addition to reducing the load of a double-sided simultaneous polishing step and a single-sided polishing step, both of maintaining the wafer flatness as that at the time when planarization step is completed and the reduction of the wafer surface roughness can be achieved. Consequently, this method can be applied to semiconductor silicon wafer production processes.

The invention claimed is:

1. A method for manufacturing silicon wafers, the method comprising, in the order indicated:
   a planarization step of grinding or lapping a front surface and a rear surface of a silicon wafer which is in a form of a thin disk and is obtained by slicing a silicon single crystal ingot;
   a single-wafer acid etching step of supplying an acid etching liquid to the surface of the planarized single silicon wafer while spinning the single silicon wafer, thereby spreading the supplied acid etching liquid over the entire wafer surface due to centrifugal force generated by spinning, and etching the entire wafer surface so as to control the surface roughness Ra of the wafer surface to 0.05 μm or less; and a double-sided simultaneous polishing step of polishing both of the front surface and the rear surface of the acid-etched single silicon wafer simultaneously, wherein the acid etching liquid is an aqueous solution containing hydrofluoric acid, nitric acid and phosphoric acid respectively, the mixing ratio as percents by weight of the hydrofluoric acid, nitric acid, phosphoric acid and water in the aqueous solution is such that hydrofluoric acid:nitric acid: phosphoric acid=4.5% to 10.5%:25.5 to 40.0%:30.0 to 45.5%, the spinning speed at which the wafer is spun in the single-wafer acid etching step is 500 to 2000 rpm, and the viscosity of the acid etching liquid is 10 to 35 mPa·sec.

2. The method for manufacturing silicon wafers according to claim 1, wherein the surface tension of the acid etching liquid is 55 to 60 dyne/cm.

3. A method for manufacturing silicon wafers, the method comprising, in the order indicated:

a planarization step of grinding or lapping a front surface and a rear surface of a silicon wafer which is in a form of a thin disk and is obtained by slicing a silicon single crystal ingot;

a single-wafer acid etching step of supplying an acid etching liquid to the surface of the planarized single silicon wafer while spinning the single silicon wafer, thereby spreading the supplied acid etching liquid over the entire wafer surface due to centrifugal force generated by spinning, and etching the entire wafer surface so as to control the surface roughness Ra of the wafer surface to 0.05 μm or less; and a single-sided polishing step of polishing one of the front surface and the rear surface of the acid-etched single silicon wafer, and then polishing the other one, wherein the acid etching liquid is an aqueous solution containing hydrofluoric acid, nitric acid and phosphoric acid respectively, the mixing ratio as percents by weight of the hydrofluoric acid, nitric acid, phosphoric acid and water in the aqueous solution is such that hydrofluoric acid:nitric acid: phosphoric acid=4.5% to 10.5%:25.5 to 40.0%:30.0 to 45.5%, the spinning speed at which the wafer is spun in the single-wafer acid etching step is 500 to 2000 rpm, and the viscosity of the acid etching liquid is 10 to 35 mPa·sec.

4. A method for manufacturing silicon wafers according to claim 3, wherein the surface tension of the acid etching liquid is 55 to 60 dyne/cm.

* * * * *

UNITED STATES PATENT AND TRADEMARK OFFICE
CERTIFICATE OF CORRECTION

| | | |
|---|---|---|
| PATENT NO. | : 7,601,644 B2 | Page 1 of 1 |
| APPLICATION NO. | : 11/597169 | |
| DATED | : October 13, 2009 | |
| INVENTOR(S) | : Koyata et al. | |

It is certified that error appears in the above-identified patent and that said Letters Patent is hereby corrected as shown below:

On the Title Page, column 1, item 86, line 16, delete "PCT/JP2005/000161" and insert --PCT/JP2005/016121--.

On the Title Page, column 1, item 87, line 19, delete "WO2006/072998" and insert --WO2006/028017--.

On the Title Page, column 1, item 87, line 20, delete "Jul. 13, 2006" and insert --Mar. 16, 2006--.

Signed and Sealed this

Fourth Day of May, 2010

David J. Kappos
*Director of the United States Patent and Trademark Office*